US008803403B2

(12) United States Patent
Huang et al.

(10) Patent No.: US 8,803,403 B2
(45) Date of Patent: Aug. 12, 2014

(54) INTER-DIGITAL BULK ACOUSTIC RESONATOR

(75) Inventors: Tsun-Che Huang, Tainan (TW); Feng-Chia Hsu, Kaohsiung County (TW); Pin Chang, Hsinchu (TW); Chin-Hung Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 290 days.

(21) Appl. No.: 13/412,641

(22) Filed: Mar. 6, 2012

(65) Prior Publication Data

US 2013/0147568 A1 Jun. 13, 2013

(30) Foreign Application Priority Data

Dec. 7, 2011 (TW) .............................. 100145070 A

(51) Int. Cl.
*H03B 5/30* (2006.01)
(52) U.S. Cl.
USPC .................... 310/321; 310/313 A; 310/313 R
(58) Field of Classification Search
CPC . H03H 9/02559; H03H 9/02574; H03H 9/24; H01L 41/0926
USPC ................................... 310/313 A, 313 R, 321
See application file for complete search history.

(56) References Cited

U.S. PATENT DOCUMENTS

| 5,815,054 A | 9/1998 | Vojak et al. |
| 6,561,028 B1 | 5/2003 | Aigner et al. |
| 6,713,938 B2 * | 3/2004 | Nguyen ........................ 310/309 |
| 6,909,221 B2 * | 6/2005 | Ayazi et al. .................... 310/321 |
| 6,930,596 B2 | 8/2005 | Kulesz et al. |
| 7,176,770 B2 | 2/2007 | Ayazi et al. |
| 7,227,432 B2 | 6/2007 | Lutz et al. |
| 7,545,238 B2 | 6/2009 | Hagelin et al. |
| 7,595,708 B2 | 9/2009 | Lutz et al. |
| 7,843,284 B2 * | 11/2010 | Ayazi et al. .................... 333/186 |

(Continued)

FOREIGN PATENT DOCUMENTS

| TW | M269647 | 7/2005 |
| TW | I284974 | 8/2007 |

(Continued)

OTHER PUBLICATIONS

Demirci et al., "Mechanically Corner-Coupled Square Microresonator Array for Reduced Series Motional Resistance," Journal of Microelectromechanical Systems 15 (6), Dec. 2006, pp. 1419-1436.

(Continued)

*Primary Examiner* — Derek Rosenau
*Assistant Examiner* — Bryan Gordon
(74) *Attorney, Agent, or Firm* — Jianq Chyun IP Office

(57) ABSTRACT

An inter-digital bulk acoustic resonator including a resonating structure, one or more input electrodes, one or more output electrodes, a substrate, and a supporting structure disposed on the substrate is provided. The resonating structure includes one or more resonating beams and a coupling beam. The resonating beams are connected at opposite two sides of the coupling beam respectively. The input electrodes and the output electrodes are arranged among the resonating beams in interlace. The input electrodes, the output electrodes, and the resonating beams are parallel to each other. Two ends of the coupling beam are connected to the supporting structure, such that the resonating structure is supported on the substrate.

20 Claims, 8 Drawing Sheets

(56) References Cited

U.S. PATENT DOCUMENTS

| | | |
|---|---|---|
| 7,855,564 B2 | 12/2010 | Sabah et al. |
| 7,911,296 B2 | 3/2011 | Nguyen et al. |
| 7,915,974 B2 | 3/2011 | Piazza et al. |
| 2004/0021403 A1* | 2/2004 | Ayazi et al. ............... 310/365 |
| 2006/0290449 A1* | 12/2006 | Piazza et al. ............... 333/187 |
| 2008/0136542 A1 | 6/2008 | Hirama |
| 2008/0224319 A1 | 9/2008 | Nakamura |
| 2010/0007444 A1 | 1/2010 | Nordin et al. |
| 2010/0181868 A1 | 7/2010 | Gaidarzhy et al. |
| 2010/0327992 A1* | 12/2010 | Suzuki ........................ 333/186 |
| 2011/0133600 A1* | 6/2011 | Kimura et al. ............ 310/313 B |
| 2011/0148252 A1* | 6/2011 | Li et al. ..................... 310/321 |

FOREIGN PATENT DOCUMENTS

| | | |
|---|---|---|
| TW | I318824 | 12/2009 |
| TW | I323340 | 4/2010 |
| TW | I325653 | 6/2010 |

OTHER PUBLICATIONS

Pourkamali et al., "Low-Impedance VHF and UHF Capacitive Silicon Bulk Acoustic Wave Resonators—Part I: Concept and Fabrication", IEEE Transactions on Electron Devices, 54 (8), Aug. 2007, pp. 2017-2023.

Cheng et al.,"High-Q, Low Impedance Polysilicon Resonators With 10 NM Air Gaps", IEEE 23rd International Conference on Micro Electro Mechanical Systems (MEMS), 2010, pp. 695-698.

Ho et al., "High-Order Composite Bulk Acoustic Resonators", IEEE 20th International Conference on Micro Electro Mechanical Systems (MEMS), Jan. 21-25, 2007, pp. 791-794.

\* cited by examiner

INTER-DIGITAL BULK ACOUSTIC RESONATOR

CROSS-REFERENCE TO RELATED APPLICATION

This application claims the priority benefit of Taiwan application serial no. 100145070, filed on Dec. 7, 2011. The entirety of the above-mentioned patent application is hereby incorporated by reference herein and made a part of this specification.

TECHNICAL FIELD

The disclosure relates to an acoustic resonator. Particularly, the disclosure relates to an inter-digital bulk acoustic resonator.

BACKGROUND

Along with development of technology, microelectromechanical oscillators are used to gradually replace existing oscillators. Generally, the microelectromechanical oscillators are used for a low-frequency application and a high-frequency application. In the low-frequency application, the microelectromechanical oscillator is used to replace a conventional quartz oscillator, and in the high-frequency application, the microelectromechanical oscillator is used to replace a surface acoustic wave (SAW) filter and a film bulk acoustic resonator (FBAR).

However, regarding a present microelectromechanical oscillator, besides a Q-factor (a Q value) of the device, impedance is also an important indicator that influences an output thereof. For example, in case of the low-frequency application, if the impedance of the device is excessively high, it represents that a gain of an amplifier is required to be increased, which may increase a current of the amplifier to cause relatively high power consumption. Moreover, in case of the high-frequency application of the communication system, the higher the impedance of the device is, the closer a reflection coefficient of the device approaches to 1, i.e. the device is not suitable to be used in the communication system because of its high insertion loss. Therefore, how to resolve the problems of the present microelectromechanical oscillator is an important issue to be developed.

SUMMARY

An embodiment of the disclosure provides an inter-digital bulk acoustic resonator including a resonating structure, one or more input electrodes, one or more output electrodes, a substrate, and a supporting structure disposed on the substrate. The resonating structure includes one or more resonating beams and a coupling beam. The resonating beams are symmetrically connected at two opposite sides of the coupling beam respectively. The input electrodes and the output electrodes are arranged in interlace among the resonating beams. The input electrodes, the output electrodes, and the resonating beams are parallel to each other. Two ends of the coupling beam are connected to the supporting structure, such that the resonating structure is supported on the substrate.

Another embodiment of the disclosure provided an inter-digital bulk acoustic resonator including a resonating structure, one or more electrodes, a substrate, and a supporting structure disposed on the substrate. The resonating structure includes a plurality of resonating beams and a coupling beam. The resonating beams are symmetrically connected at two opposite sides of the coupling beam respectively. The electrodes are disposed at adjacent sides of the resonating beams and separated from each other through one or more capacitor gaps. Two ends of the coupling beam are connected to the supporting structure, such that the resonating structure is supported on the substrate.

Another embodiment of the disclosure provides an inter-digital bulk acoustic resonator including a first resonating structure, one or more electrodes, a second resonating structure, a substrate, and a supporting structure disposed on the substrate. The first resonating structure includes a plurality of resonating beams and a coupling beam. The resonating beams are symmetrically connected at two opposite sides of the coupling beam respectively. The electrodes are disposed at adjacent sides of the resonating beams and separated from each other through one or more capacitor gaps. The second resonating structure includes a plurality of resonating beams and a coupling beam. The resonating beams are symmetrically connected at two opposite sides of the coupling beam respectively. The electrodes are disposed at adjacent sides of the resonating beams and separated from each other through one or more capacitor gaps. Two ends of the coupling beam are connected to the supporting structure, such that the first and the second resonating structures are supported on the substrate.

In order to make the aforementioned of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

The same or like parts in the following embodiments that have a length or size difference are denoted by the same referential numbers, and descriptions of the same parts are not repeated.

As long as a length, size or wavelength calculation is close to that described in the disclosure, it is still construed to be within the scope of the disclosure.

Figure 1:
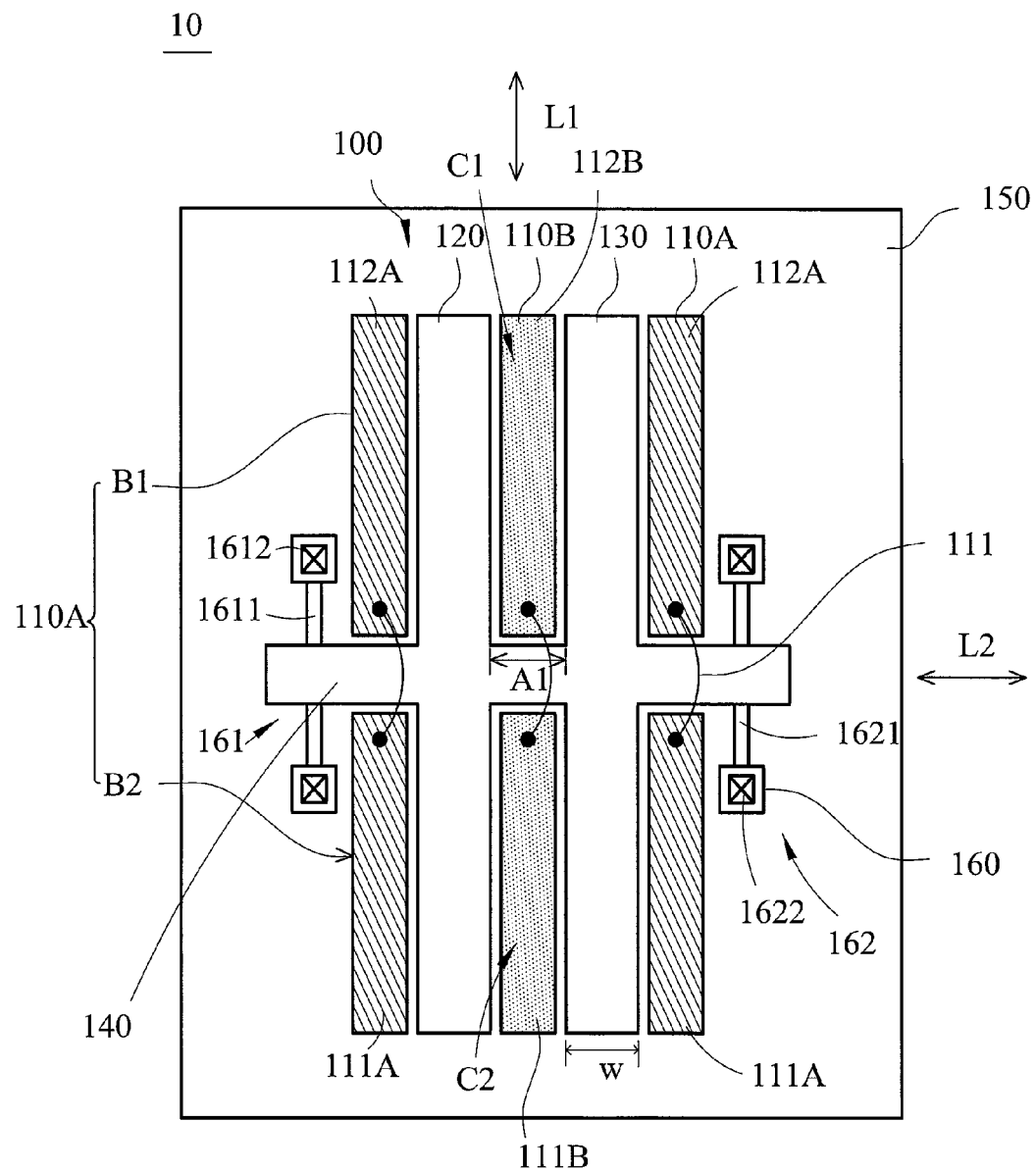
FIG. 1 is a top view of an inter-digital bulk acoustic resonator according to a first embodiment of the disclosure.

FIG. 1 is a top view of an inter-digital bulk acoustic resonator according to an embodiment of the disclosure. Referring to FIG. 1, in the one embodiment, the inter-digital bulk acoustic resonator 10 is a bulk mode resonator, which includes a resonating structure 100, at least one input electrode 110A, at least one output electrode 110B and a supporting structure 160. The resonating structure 100 includes a plurality of resonating beams 120 and 130 and a coupling beam 140. The plurality of resonating beams 120 and 130 are symmetrically connected at two opposite sides of the coupling beam 140, respectively. The plurality of resonating beams 120 and 130 and the coupling beam 140 are located on a same plane, and the plurality of resonating beams 120 and 130 are perpendicular to the coupling beam 140. The plurality of resonating beams 120 and 130 and the coupling beam 140 can be formed integrally. The input electrode 110A and the output electrode 110B are arranged among the resonating beams 120 and 130 in interlace without contacting, as that shown in FIG. 1. Namely, one or more electrodes are disposed at adjacent sides of the resonating beams 120 and 130 and are separated from each other through one or more capacitor gaps.

For simplicity's sake, a position relationship of the input electrodes and the output electrodes is defined, and materials of the input electrode and the output electrode can be the same. In order to electrically connect the input electrodes 110A disposed at different sides of the coupling beam 140, each of the input electrodes 110A includes a first member B1 and a second member B2 separated from each other and located at two sides of the coupling beam 140, and the first member B1 and the second member B2 are connected through a conductive structure 111. In order to electrically connect the output electrodes 110B disposed at different sides of the coupling beam 140, each of the output electrodes 110B includes a third member C1 and a fourth member C2 separated from each other and located at two sides of the coupling beam 140, and the third member C1 and the fourth member C2 are connected through the conductive structure 111. The input electrodes 110A, the output electrodes 110B and the resonating beams 120 and 130 are disposed in parallel, and the input electrodes 110A, the output electrodes 110B and the resonating beams 120 and 130 all extend along a first axial direction L1, and are arranged in interlace along a second axial direction L2.

In an embodiment, the first axial direction L1 is perpendicular to the second axial direction L2 and is located in a same plane with the input electrodes 110A, the output electrodes 110B and the resonating beams 120 and 130. In this way, the input electrodes 110A and the output electrodes 110B are respectively connected to an application specific integrated circuit (ASIC), such that the input electrodes 110A and the output electrodes 110B can drive and sense vibrations of the resonating beams 120 and 130 along the second axial direction L2.

In an embodiment, the input electrode 110A can be served as an input electrode, and the output electrode 110B can be served as an output electrode. In another embodiment, the input electrode 110A can be served as an output electrode, and the output electrode 110B can be served as an input electrode. The at least one input electrode 110A may include a plurality of input electrodes, for example, and the at least one output electrode 110B may include a plurality of output electrodes, for example.

In an embodiment of the disclosure, the input electrode 110A has a first end 111A and a second end 112A, where the first end 111A or the second end 112A of the input electrode 110A can be served as a power input terminal. The output electrode 110B has a first end 111B and a second end 112B, where the first end 111B or the second end 112B of the output electrode 110B can be served as a power output terminal. Alternatively, the output electrode 110B can be served as a power input terminal, and the input electrode 110A can be served as a power output terminal. Input signals of the power input terminal and the power output terminal are supplied by the ASIC.

Moreover, the plurality of resonating beams 120 and 130 are disposed in parallel and are connected to the two sides of the coupling beam 140, wherein a width W of the resonating beams 120 and 130 is $W=(2n+1)\times\lambda/2$, wherein n is 0, 1, 2, 3, 4, . . . . Moreover, a length A1 of the coupling beam 140 between the two resonating beams 120 and 130 is $A1=(m+1)\times\lambda/4$, wherein m is 0, 1, 2, 3, 4, . . . . When m=1 and n=0, i.e. the length A1 of the coupling beam 140 is $\lambda/2$, and the width W of the resonating beam is also $\lambda/2$, such that the inter-digital bulk acoustic resonator 10 has a better excitation mode and an output power.

In other words, now, the length A1 of the coupling beam 140 between the two resonating beams 120 and 130 is equal to a half of a resonating wavelength of the resonating beams 120 and 130 in a resonating state. In an exemplary embodiment, the length A1 of the coupling beam 140 between the two resonating beams 120 and 130 is equal to the width W of the resonating beams 120 and 130. However, the disclosure is not limited to the situation that the length A1 of the coupling beam 140 between the two resonating beams 120 and 130 is equal to the width W of the resonating beam 120, and other implementations are also considered to be within the scope of the disclosure.

According to the above descriptions, in an embodiment of the disclosure, the two adjacent resonating beams 120 and 130 arranged in parallel are connected to the coupling beam 140, and the input electrode 110A and the output electrode 110B are disposed in interlace between the resonating beams 120 and 130 so as to form the bulk mode resonating structure 100 extending along the first axial direction L1 and vibrating along the second axial direction L2. The inter-digital bulk acoustic resonator 10 can not only increase a capacitor sensing area because of the resonating beams 120 and 130 extending along the first axial direction L1, but also expand the capacitor sensing area of the resonating structure 100 in a two-dimensional space because of the coupling beam 140 connecting a plurality of the resonating beams 120 and 130 in parallel, so as to effectively reduce an impedance of the inter-digital bulk acoustic resonator 10 and increase output performance thereof.

Referring to FIG. 1, in an embodiment, a whole shape of the resonating structure 100 is similar to a fence structure, and every two resonating beams 120 and 130 has a double "+" structure. The input electrodes 110A and the output electrodes 110B are separated at two opposite sides of the coupling beam 140, i.e. the input electrodes 110A and the output electrodes 110B are disposed in interlace at spaces of the fence structure formed by the resonating beam 120 and 130 and the coupling beam 140. In other words, the input and output electrodes 120 and 130 are sequentially disposed at the spaces between the resonating beams 120 and 130 of the fence structure in a sequence of the input electrode 110A, the output electrode 110B, the input electrode 110A, the output electrode 110B, and the input electrode 110A, etc. In an embodiment, the input electrode 110A can be served as the input electrode, and the output electrode 110B can be served as the output electrode, and as described above, the input electrode, the output electrode, the input electrode, the output electrode, the input electrode, . . . , etc. are disposed in interlace in the fence structure, i.e. among the resonating beams. The input electrodes 110A, the output electrodes 110b and the resonating beams 120 and 130 are disposed in parallel. The input electrode 110A is separated into the first member B1 and the second member B2 by the coupling beam 140, and the output electrode 110B is separated into the third member C1 and the fourth member C2 by the coupling beam 140. The resonating beam 120 is driven to oscillate through the first member B1 and the second member B2, and the third member C1 and the fourth member C2 senses the oscillation of the resonating beam 120.

In an embodiment, a polysilicon conductive structure 111 crosses over the coupling beam 140 to electrically connect the first member B1 and the second member B2 of the input electrode 110A, and conductive structure 111, a metal wire, is used to electrically connect the third member C1 and the fourth member C2 of the output electrode 110B, so that the first end 111A and the second end 112A of the input electrode 110A at the same side of the resonating beams 120 and 130 have a same driving potential, or the first end 111B and the second end 112B of the output electrode 110B have the same driving potential, wherein the conductive structure 111 can be a polysilicon wire or a metal wire, etc.

On the other hand, the inter-digital bulk acoustic resonator 10 further comprises a substrate 150 (silicon substrate) and the supporting structure 160 disposed on the substrate 150. Two ends of the coupling beam 140 are connected to the supporting structure 160, such that the supporting structure 160 supports the resonating beams 120 and 130 and the coupling beam 140 on the substrate 150. In an embodiment, the supporting structure 160 is configured on the coupling beam 140. The supporting structure 160 includes a first supporting member 161 and a second supporting member 162. The first supporting member 161 includes a first supporting element 1611 and a first fixing base 1612, wherein the first supporting element 1611 is disposed on the first fixing base 1612, and one end of the coupling beam 140 is disposed on the first supporting element 1611. The second supporting member 162 includes a second supporting element 1621 and a second fixing base 1622, wherein the second supporting element 1621 is disposed on the second fixing base 1622, so that another end of the coupling beam 140 is disposed on the second supporting element 1621.

In an embodiment, there are two first fixing bases 1612, which are respectively disposed at two ends of the first supporting element 1611, such that the first supporting element 1611 is suspended there between. There are two second fixing bases 1622, which are respectively disposed at two ends of the second supporting element 1621, such that the second supporting element 1621 is suspended there between.

Figure 5:
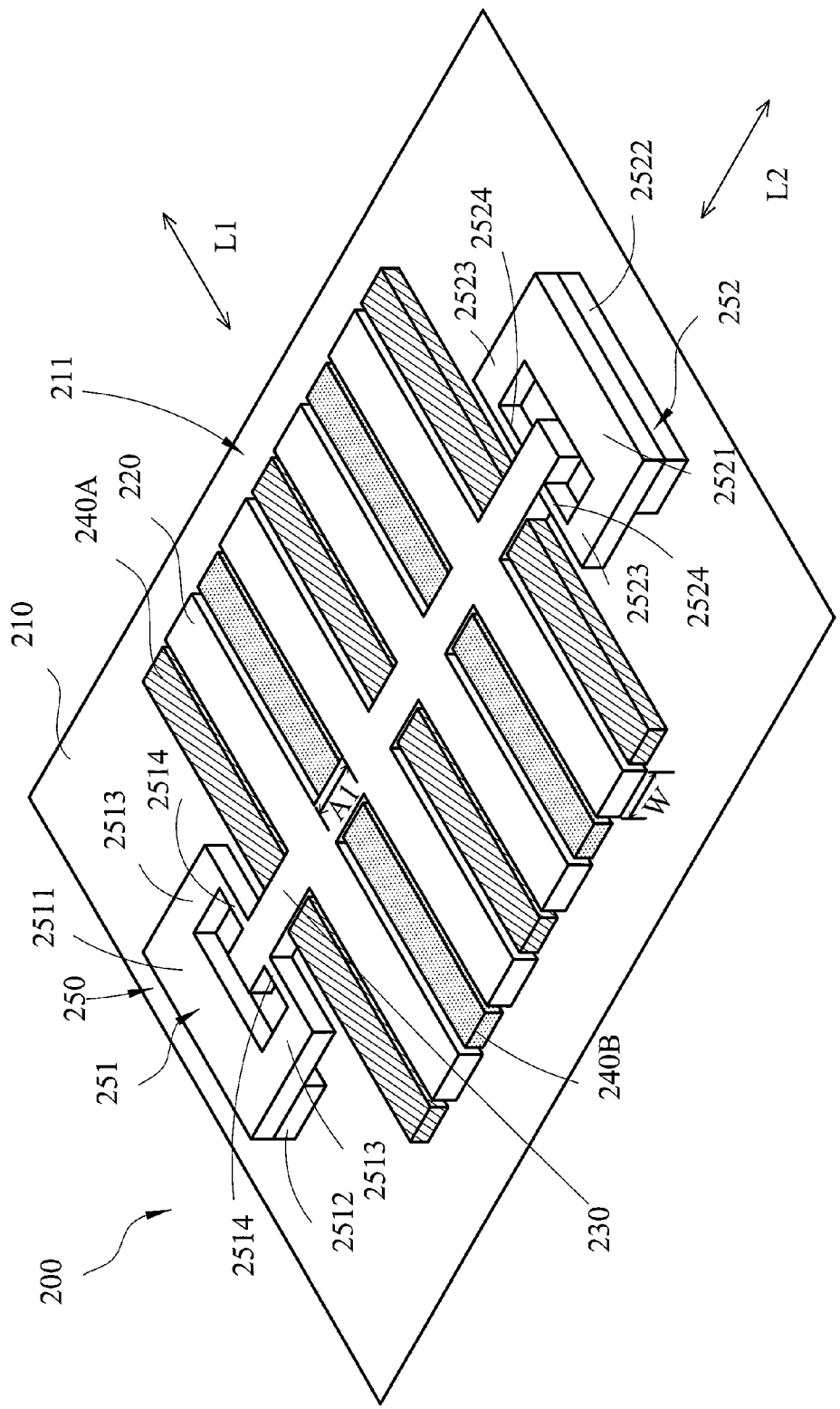
FIG. 5 is a schematic diagram of an inter-digital bulk acoustic resonator according to a fifth embodiment of the disclosure.

In another embodiment, the numbers of the first fixing bases 1612 and the second fixing bases 1622 are respectively one, and the first supporting element 1611 and the second supporting element 1621 respectively have two arms stretched out, wherein the two arms are respectively connected to a first elastic supporting member and a second elastic supporting member, such that the first elastic supporting member and the second elastic supporting member are respectively connected to the coupling beam 140, and the first elastic supporting member and the second elastic supporting member support the coupling beam 140 to vibrate, and such implementation is as that shown in FIG. 5.

In the disclosure, each two adjacent sides of the resonating beams 120 and 130 are not limited to have a same electrical phase, i.e. configuration structures of the input electrodes 110A and the output electrodes 110B are not limited by the disclosure.

Figure 2:
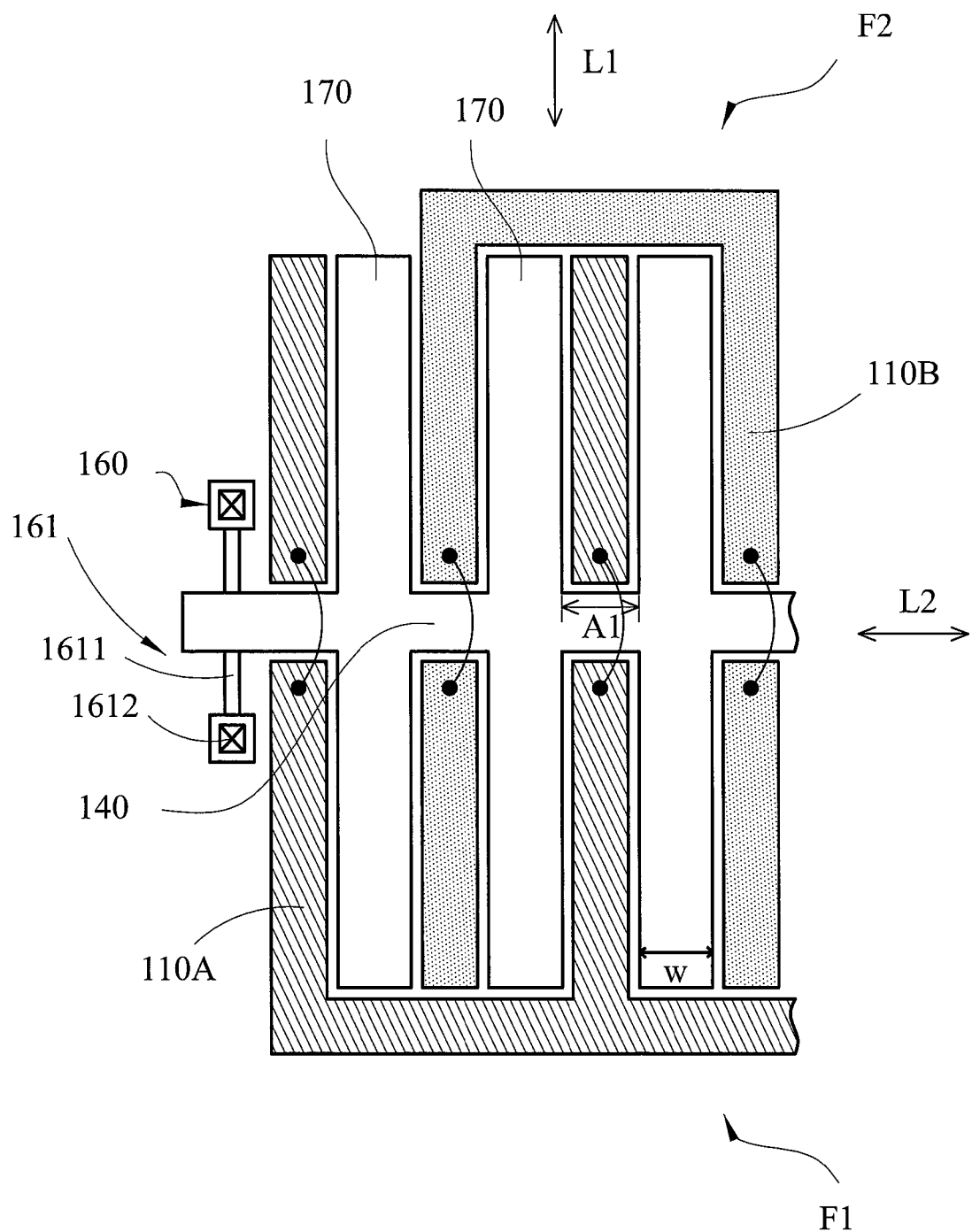
FIG. 2 is a top view of an inter-digital bulk acoustic resonator according to a second embodiment of the disclosure.

FIG. 2 is a top view of an inter-digital bulk acoustic resonator according to another embodiment of the disclosure. Referring to FIG. 2, different to the aforementioned embodiment, ends of the input electrodes 110A or the output electrodes 110B located at the same side of the coupling beam 140 and having the same potential can be connected to each other on a same plane to form a digital-like structure F1 or F2, so that the electrodes 110A and 110B of the embodiment are disposed between resonating beams 170 to form the digital-like structures F1 and F2 opposite to each other.

Moreover, the numbers of the resonating beams 170 and the coupling beams 140 are not limited by the disclosure, as shown in FIG. 2, a designer can design a parallel structure of a plurality of the resonating beams 170 and the coupling beams 140 along the second axial direction L2 according to a usage requirement.

Figure 3:
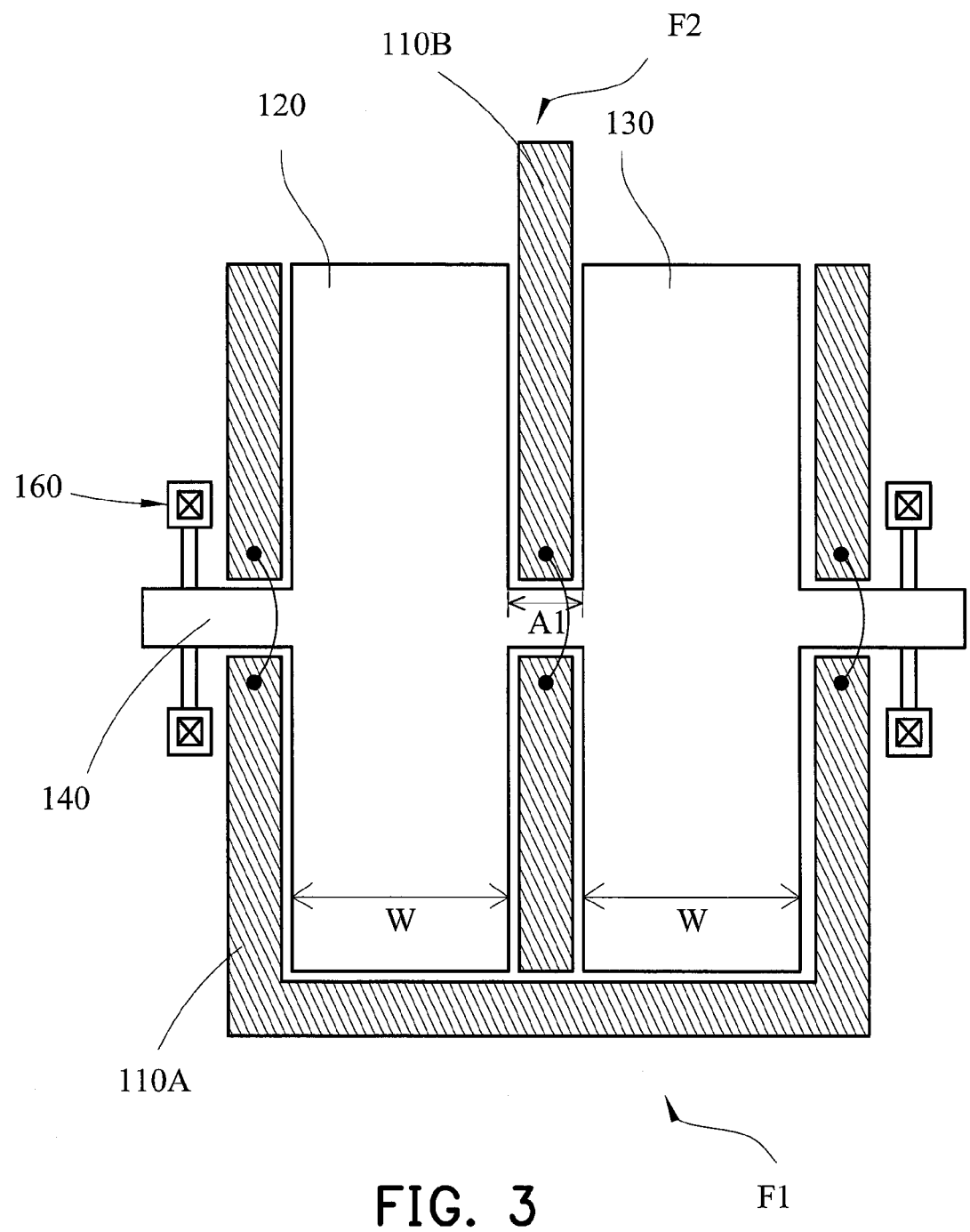
FIG. 3 is a top view of an inter-digital bulk acoustic resonator according to a third embodiment of the disclosure.

Referring to FIG. 3, FIG. 3 is a top view of an inter-digital bulk acoustic resonator according to a third embodiment of the disclosure. A structure of the inter-digital bulk acoustic resonator of the embodiment is similar to that of the aforementioned embodiment, and a difference there between is that lengths of the resonating beams 120 and 130 of the embodiment are different to that of the aforementioned embodiment. In the embodiment, a width W of the resonating beams 120 and 130 is $W=(2n+1)\times\lambda/2$, wherein n is 0, 1, 2, 3, 4, . . . . Moreover, a length A1 of the coupling beam 140 between the two resonating beams 120 and 130 is $A1=(m+1)\times\lambda/4$, wherein m is 0, 1, 2, 3, 4, . . . . When m=1 and n=1, the length A1 of the coupling beam 140 between the two resonating beams 120 and 130 is $\lambda/2$, and the width W of the resonating beams 120 and 130 is $3\lambda/2$, and the width W of the resonating beams 120 and 130 is broadened. The length A1 of the coupling beam 140 between the two resonating beams 120 and 130 is $\lambda/2$, and $\lambda$ is a resonating wavelength of the resonating beams 120 and 130 in the resonating state. The disclosure is not limited to a situation that the width W of the resonating beams 120 and 130 is equal to a half wavelength of a resonating frequency.

Ends of the input electrodes 110A or the output electrodes 110B located at the same side of the coupling beam 140 and having the same potential can be connected to each other on a same plane to form a digital-like structure F1 or F2, so that the electrodes 110A and 110B of the embodiment are disposed between the resonating beams 120 and 130 to form the digital-like structures F1 and F2 opposite to each other.

Figure 4:
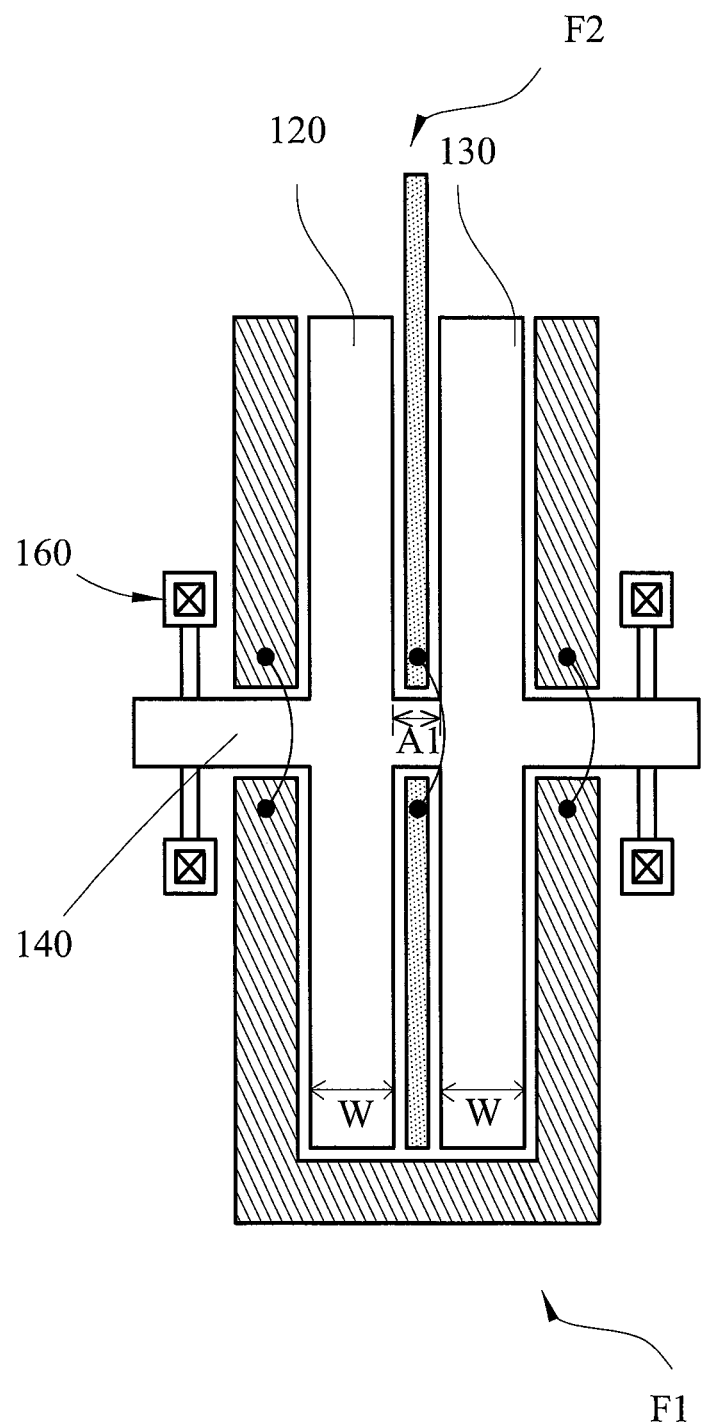
FIG. 4 is a top view of an inter-digital bulk acoustic resonator according to a fourth embodiment of the disclosure.

Referring to FIG. 4, FIG. 4 is a top view of an inter-digital bulk acoustic resonator according to a fourth embodiment of the disclosure. A structure of the inter-digital bulk acoustic resonator of the embodiment is similar to that of the aforementioned embodiment, and a difference there between is that lengths of the resonating beams 120 and 130 of the embodiment are different to that of the aforementioned embodiment. In the embodiment, a width W of the resonating beams 120 and 130 is $W=(2n+1)\times\lambda/2$, wherein n is 0, 1, 2, 3, 4, . . . . Moreover, a length A1 of the coupling beam 140 between the two resonating beams 120 and 130 is $A1=(m+1)\times\lambda/4$, wherein m is 0, 1, 2, 3, 4, . . . . When m=0 and n=0, the length A1 of the coupling beam 140 between the two resonating beams 120 and 130 is $\lambda/4$, and the length A1 of the coupling beam 140 between the two resonating beams 120 and 130 is narrowed, and the width W of the resonating beams 120 and 130 is $\lambda/2$, i.e. the width of the resonating beams 120 and 130 is $W=\lambda/2$, and $\lambda$ is a resonating wavelength of the resonating beams 120 and 130 in the resonating state. Ends of the input electrodes 110A or the output electrodes 110B located at the same side of the coupling beam 140 and having the same potential can be connected to each other on a same plane to form a digital-like structure F1 or F2, so that the electrodes 110A and 110B of the embodiment are disposed between the resonating beams 120 and 130 to form the digital-like structures F1 and F2 opposite to each other.

Figure 6:
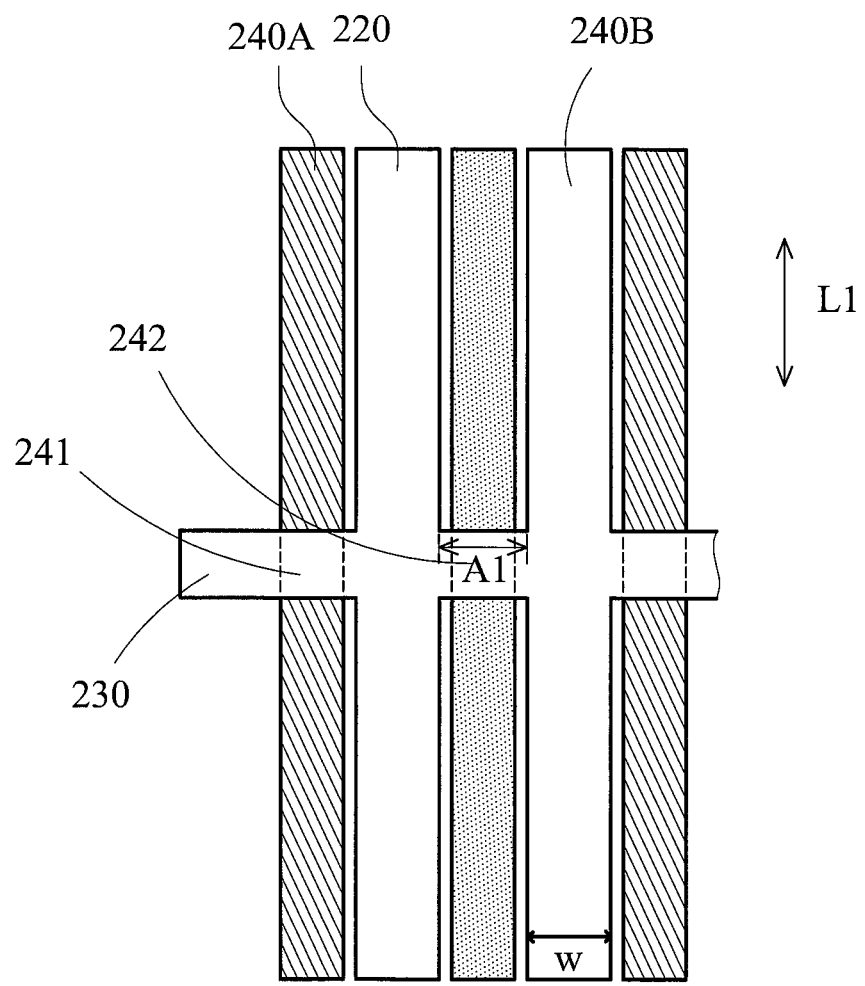
FIG. 6 is a partial top view of the inter-digital bulk acoustic resonator of FIG. 5.

FIG. 5 is a schematic diagram of an inter-digital bulk acoustic resonator according to a fifth embodiment of the disclosure. FIG. 6 is a partial top view of the inter-digital bulk acoustic resonator of FIG. 5. Referring to FIG. 5 and FIG. 6, in the embodiment, the inter-digital bulk acoustic resonator 200 includes a substrate 210, a resonating structure 211 including a plurality of resonating beams 220 and a coupling beam 230, a plurality of input electrodes 240A, a plurality of output electrodes 240B and a pair of supporting structures 250. The supporting structures 250 are disposed on the substrate 210. The supporting structure 250 includes a first supporting member 251 and a second supporting member 252. The first supporting member 251 includes a first supporting element 2511 and a first fixing base 2512, where the first supporting element 2511 is disposed on the first fixing base 2512, and one end of the coupling beam 230 is disposed on the first supporting element 2511. The second supporting member 252 includes a second supporting element 2521 and a second fixing base 2522, wherein the second supporting element 2521 is disposed on the second fixing base 2522, so that another end of the coupling beam 140 is disposed on the second supporting element 2521. In an embodiment, the first supporting element 2511 and the second supporting element 2521 respectively have two arms 2513 and 2523 stretched out, wherein the two arms 2513 and 2523 are respectively connected to a first elastic supporting member 2514 and a second elastic supporting member 2524, such that the first elastic supporting member 2514 and the second elastic supporting member 2524 are respectively connected to the two ends of the coupling beam 230, and the coupling beam 230 vibrates with supporting of the first elastic supporting member 2514 and the second elastic supporting member 2524.

The plurality of resonating beams 220 are symmetrically connected at two sides of the coupling beam 230. The resonating beams 220 and the coupling beam 230 are located on a same plane, and the resonating beams 220 are perpendicular to the coupling beam 230. The resonating beams 220 and the coupling beam 230 can be formed integrally. The resonating beams 220 are symmetrically connected at two sides of the coupling beam 230 to form a fence structure, and the supporting structures 250 are connected to two opposite ends of the coupling beam 230 such that the supporting structures 250 support the resonating beams 220 and the coupling beam 230 on the substrate 210. The input electrodes 240A and the output electrodes 240B are disposed in interlace at the gaps of the fence structure of the resonating structure 211, so that the input and output electrodes 240A, 240B are disposed in interlace with the resonating beams 220, wherein the input electrodes 240A, the output electrodes 240B and the resonating beams 220 are parallel to each other, i.e. the resonating beams 220, the input electrodes 240A and the output electrodes 240B extend along the first axial direction L1, and are arranged along the second axial direction L2. It could be noticed that the input electrodes 240A and the output electrodes 240B cross over the coupling beam 230 from the top or bottom along the first axial direction L1, so that the same resonating beam 220 can be driven by the input electrode 240A, and sensed by the output electrode 240B. Moreover, similar to the embodiment of FIG. 2, the input electrodes 240A or the output electrodes 240B located at the same side of the coupling beam 230 and having the same potential can be connected to form a digital-like structure on a same plane, which is not repeated the same structures.

As shown in FIG. 6, the input electrodes 240A or the output electrodes 240B can be formed integrally under the coupling beam 230, and the input electrodes 240A or the output electrodes 240B has grooves 241 or 242 under the coupling beam 230 to accommodate the input electrodes 240A or the output electrodes 240B.

The structure of the inter-digital bulk acoustic resonator of the embodiment is similar to that of the embodiment of FIG. 2, and differences there between lie in: (1) the coupling beam 230 is disposed in the grooves 241 or 242 of the input electrodes 240A or the output electrodes 240B, (2) a design of the supporting structures 251 and 252.

Figure 7:
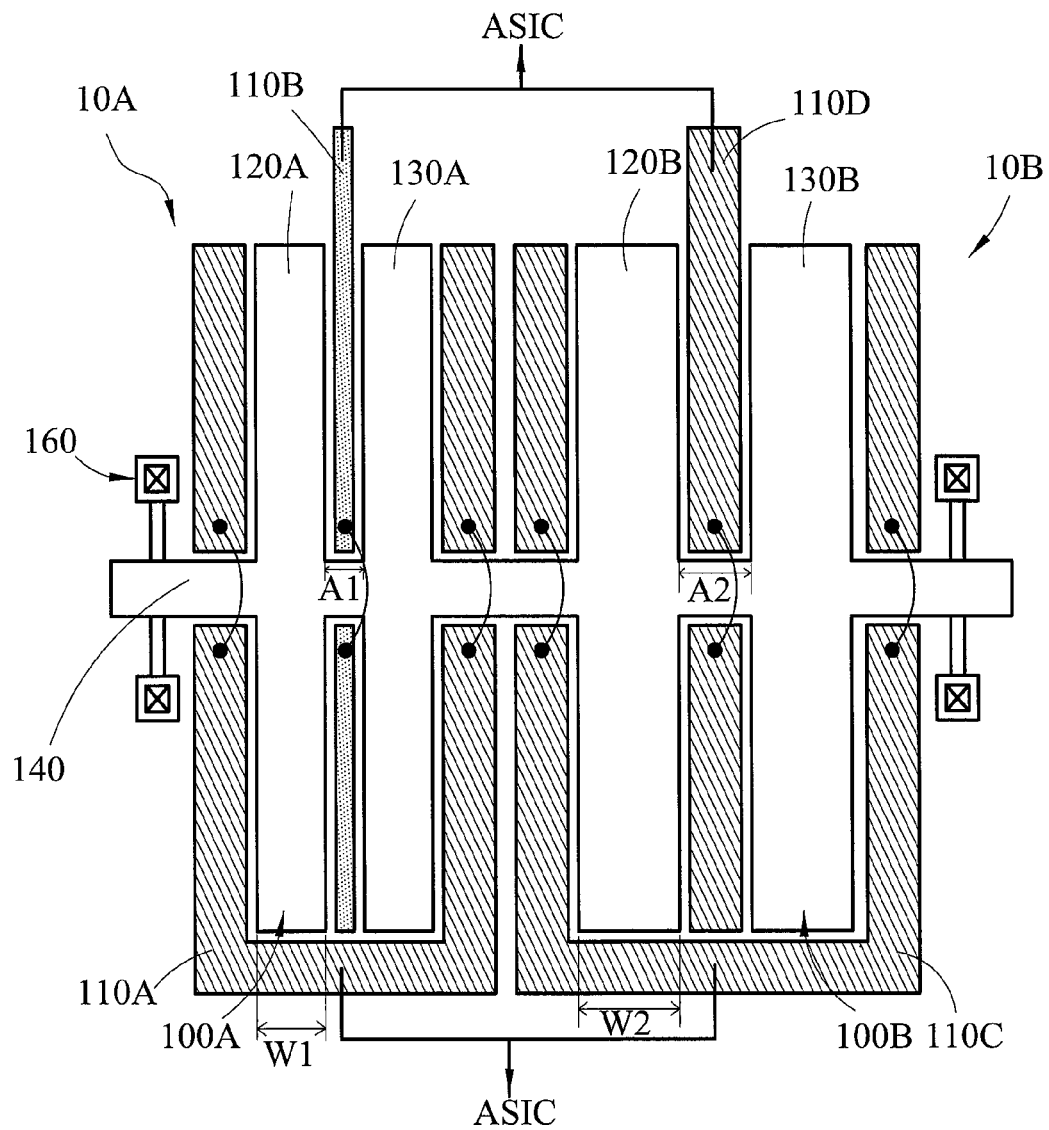
FIG. 7 is a top view of an inter-digital bulk acoustic resonator having a dual-frequency output function according to a sixth embodiment of the disclosure.

Referring to FIG. 7, FIG. 7 is a top view of an inter-digital bulk acoustic resonator having a dual-frequency output function according to a sixth embodiment of the disclosure. In the embodiment, two inter-digital bulk acoustic resonators 10A and 10B are connected in parallel to respectively output a resonating frequency signal, and the resonating frequency signals are transmitted to an ASIC chip. For example, the input electrode 110A and the input electrode 110C are commonly electrically connected to the ASIC chip, and the output electrode 110B and the output electrode 110D are commonly electrically connected to the ASIC chip. The ASIC chip provides a signal to the input electrodes 110A and 110C, and the input electrodes 110A and 110C drive resonating beams 120A, 120B, 130A and 130B to oscillate, and the output electrodes 110B and 110D senses an oscillation frequency of the resonating beams 120A, 120B, 130A and 130B, and output a resonating frequency to the ASIC chip.

The structures of the inter-digital bulk acoustic resonators 10A and 10B can be the structures of the aforementioned embodiments, though the disclosure is not limited thereto, and any embodiment complied with the spirit of the disclosure is construed to be within the scope of the disclosure.

The structures of the inter-digital bulk acoustic resonators 10A and 10B respectively include a first and a second resonating structures 100A and 100B, and the first and the second resonating structures 100A and 100B have a coupling beam 140 to connect the first and the second resonating structures 100A and 100B. The first and the second resonating structures 100A and 100B respectively includes one or more the resonating beams 120A, 120B, 130A and 130B. The first resonating structure 100A and the second resonating structure 100B can be implemented by the resonating structure of the embodiment of FIG. 2, FIG. 3 or FIG. 4, and descriptions thereof are not repeated the same structures again.

A width of the resonating beams 120A and 130A is W1, and a width of the resonating beams 120B and 130B is W2. The width W1 of the aforementioned resonating beams 120A and 130A is $W1=(2n+1)\times\lambda/2$, wherein n is 0, 1, 2, 3, 4, ..., and the length A1 of the coupling beam 140 between the two resonating beams 120A and 130A is $A1=(m+1)\times\lambda/4$, wherein m is 0, 1, 2, 3, 4, ..., and the resonating frequency of the first resonating structure 100A is $f_1$. The width W2 of the resonating beams 120B and 130B is $W2=(2n'+1)\times\lambda'/2$, wherein n' is 0, 1, 2, 3, 4, .... The length A2 of the coupling beam 140 between the two resonating beams 120B and 130B is $A2=(m'+1)\times\lambda'/4$, wherein m' is 0, 1, 2, 3, 4, ..., and the resonating frequency of the second resonating structure 100B is $f_2$.

In this way, when the width W1 is not equal to the width W2, the first and the second resonating structures 100A and 100B can output the two frequencies $f_1$ and $f_2$, wherein the width W1 of the resonating beams 120A and 130A is a half wavelength of the resonating frequency $f_1$ of the resonating beams, and the width W2 of the resonating beams 120B and 130B is a half wavelength of the resonating frequency $f_2$ of the resonating beams.

Figure 8:
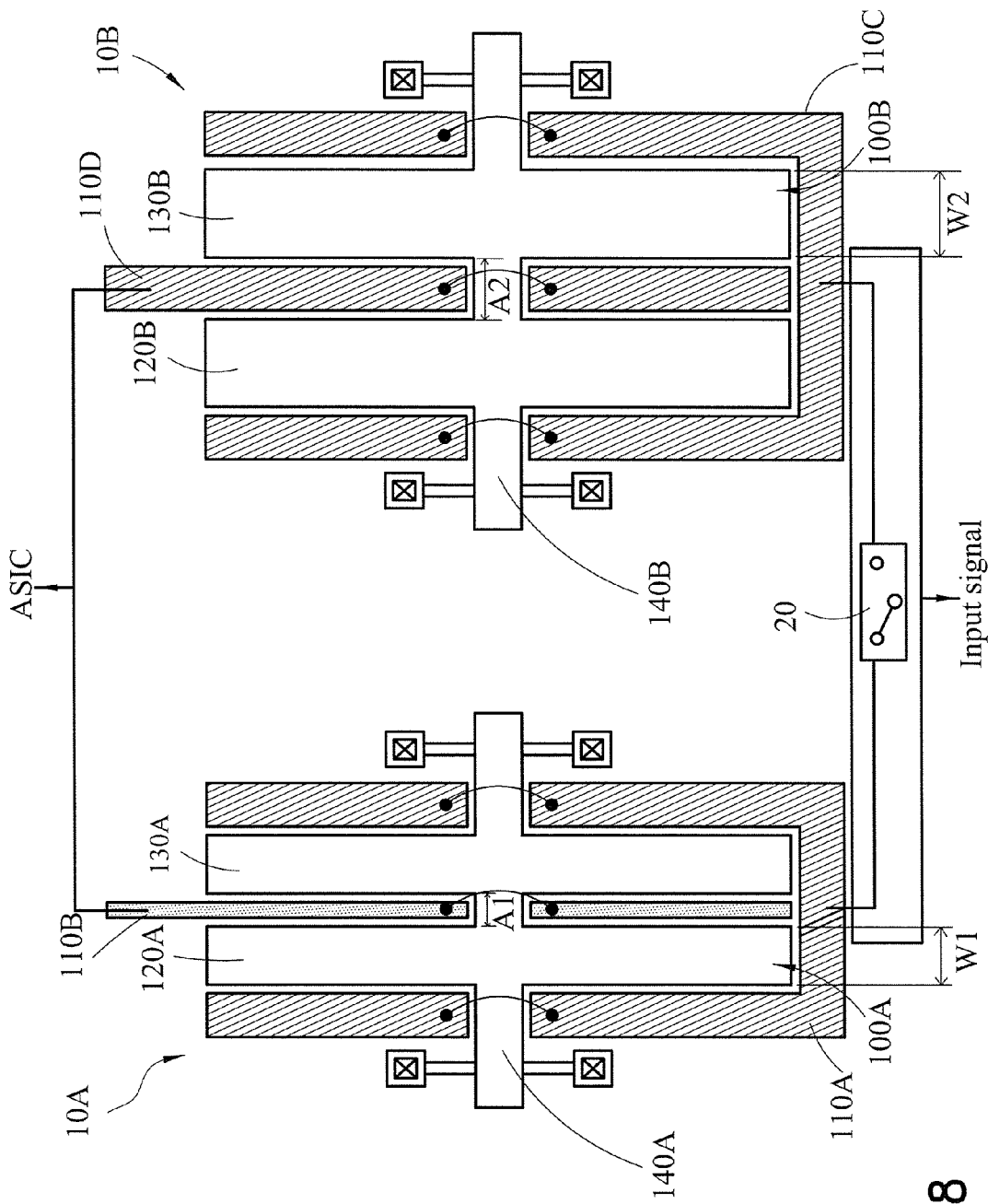
FIG. 8 is a top view of an inter-digital bulk acoustic resonator having a frequency-selection output function according to a seventh embodiment of the disclosure.

Referring to FIG. 8, FIG. 8 is a top view of an inter-digital bulk acoustic resonator having a frequency-selection output function according to a seventh embodiment of the disclosure. In the embodiment, the two inter-digital bulk acoustic resonators 10A and 10B are disposed in separation to respectively output resonating frequencies, and the resonating frequencies are transmitted to the ASIC chip. For example, the input electrode 110A and the input electrode 110C are commonly electrically connected to the ASIC chip, and the output electrode 110B and the output electrode 110D are commonly electrically connected to the ASIC chip.

The ASIC chip provides a signal to the input electrodes 110A and 110C, and the input electrodes 110A and 110C drive the resonating beams 120A, 120B, 130A and 130B to oscillate, and the output electrodes 110B and 110D senses an oscillation frequency of the resonating beams 120A, 120B, 130A and 130B, and output a resonating frequency to the ASIC chip. A selection function circuit 20 is used to connect the first and the second resonating structures 100A and 100B. The ASIC chip inputs a signal to the selection function circuit 20 to selectively drive the first resonating structure 100A or the second resonating structure 100B, so as to achieve a frequency selection function of the output signal.

The structures of the inter-digital bulk acoustic resonators 10A and 10B can be the structures of the aforementioned embodiments, though the disclosure is not limited thereto, and any embodiment complied with the spirit of the disclosure is construed to be within the scope of the disclosure.

The first and the second resonating structures 100A and 100B respectively includes one or more the resonating beams 120A, 120B, 130A and 130B, and the first resonating structure 100A and the second resonating structure 100B can be implemented by the resonating structure of the embodiment of FIG. 2, FIG. 3 or FIG. 4, and descriptions thereof are not repeated the same structures again. A width of the resonating beams 120A and 130A is W1, and a width of the resonating beams 120B and 130B is W2. The width W1 of the aforementioned resonating beams 120A and 130A is $W1=(2n+1)\times\lambda/2$, wherein n is 0, 1, 2, 3, 4, . . . , and the length A1 of the coupling beam 140A between the two resonating beams 120A and 130A is $A1=(m+1)\times\lambda/4$, wherein m is 0, 1, 2, 3, 4, . . . , and the resonating frequency of the first resonating structure 100A is $f_1$. The width W2 of the resonating beams 120B and 130B is $W2=(2n'+1)\times\lambda'/2$, wherein n' is 0, 1, 2, 3, 4, . . . . The length A2 of the coupling beam 140B between the two resonating beams 120B and 130B is $A2=(m'+1)\times\lambda'/4$, wherein m' is 0, 1, 2, 3, 4, . . . , and the resonating frequency of the second resonating structure 100B is $f_2$. Therefore, the selection function circuit 20 can selectively drive the first resonating structure 100A or the second resonating structure 100B, so as to achieve the frequency-selection function of the output signal.

In summary, in the embodiments of the disclosure, the inter-digital bulk acoustic resonator suitable for generating bulk mode resonation is provided, in which the coupling beam is used to connect the resonating beams arranged in parallel to form the resonating structure, wherein a length of the coupling beam is a half of a resonating wavelength. In this way, not only the resonating beams can extend along an extending direction thereof to increase a sensing area, but also the coupling beam can be used connect a plurality of the resonating beams arranged in parallel. In other words, the resonating structure formed by the resonating beams and the coupling beam can be expanded in a two-dimensional space, so that the capacitor sensing area can be effectively increased to reduce the impedance of the resonator, so as to increase the output performance thereof.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An inter-digital bulk acoustic resonator, comprising:
   a resonating structure, comprising one or more resonating beams and a coupling beam, wherein the resonating beams are respectively connected at two opposite sides of the coupling beam, and the resonating beams are perpendicular to the coupling beam;
   at least one input electrode and at least one output electrode, wherein the input electrode and the output electrode are arranged in interlace between the resonating beams, the input electrode is disposed at two sides of the coupling beam, and the output electrode is disposed at two sides of the coupling beam, the input electrode, the output electrode and the resonating beams are disposed in parallel to each other, and the input electrode or the output electrode and two adjacent resonating beams respectively form a capacitor space, such that the input electrode drives the two adjacent resonating beams to vibrate or the output electrode senses a capacitance variation generated due to vibration of the two adjacent resonating beams;
   a substrate; and
   a supporting structure, disposed on the substrate, wherein the coupling beam or the resonating structure is supported on the substrate.

2. The inter-digital bulk acoustic resonator as claimed in claim 1, wherein the resonating beam is a bulk mode resonator, and a width of the resonating beam is $(2\times n+1)\times\lambda/2$, wherein n is 0, 1, 2, 3, 4, . . . , and λ is a resonating wavelength of the resonating beams in a resonating state.

3. The inter-digital bulk acoustic resonator as claimed in claim 1, wherein the input electrode comprises a first member and a second member separated from each other and located at two sides of the coupling beam, and the first member and the second member are connected through a conductive structure, the output electrode comprises a third member and a fourth member separated from each other and located at two sides of the coupling beam, and the third member and the fourth member are connected through the conductive structure.

4. The inter-digital bulk acoustic resonator as claimed in claim 1, wherein further comprises a first axial direction is perpendicular to a second axial direction, and the input electrode, the output electrode and the resonating beams extend along the first axial direction, and are arranged in interlace along the second axial direction, wherein the first axial direction, the second axial direction and the input electrode, the output electrode, the resonating beams and the coupling beam are on a same plane.

5. The inter-digital bulk acoustic resonator as claimed in claim 1, wherein the input electrode and the output electrode are respectively connected to an application specific integrated circuit (ASIC), such that the input electrode and the output electrode drives and senses vibration of the resonating beam along the second axial direction.

6. The inter-digital bulk acoustic resonator as claimed in claim 1, wherein a length of the coupling beam between the two resonating beams is $(m+1)\times\lambda/4$, wherein m is 0, 1, 2, 3, 4, . . . , and λ is a resonating wavelength of the resonating beams in a resonating state.

7. The inter-digital bulk acoustic resonator as claimed in claim 1, wherein a length of the coupling beam between the two resonating beams is equal to a width of the coupling beam.

8. The inter-digital bulk acoustic resonator as claimed in claim 1, wherein a cross-section of the resonating beam is a rectangle.

9. The inter-digital bulk acoustic resonator as claimed in claim 1, wherein a material of the resonating structure is an anisotropic material.

10. The inter-digital bulk acoustic resonator as claimed in claim 1, wherein the conductive structure is a polycrystalline semiconductor material or metal.

11. The inter-digital bulk acoustic resonator as claimed in claim 1, wherein the supporting structure comprises a first supporting member and a second supporting member, the first supporting member comprises a first supporting element and a first fixing base, the first supporting element is disposed on the first fixing base, such that one end of the coupling beam is disposed on the first supporting element, and the second supporting member comprises a second supporting element and a second fixing base, the second supporting element is disposed on the second fixing base, such that another end of the coupling beam is disposed on the second supporting element.

12. The inter-digital bulk acoustic resonator as claimed in claim 1, wherein one ends of the input electrode or the output electrode located at the same side of the coupling beam and having a same potential are connected to each other to form a digital-like structure.

13. The inter-digital bulk acoustic resonator as claimed in claim 1, wherein the input electrode is formed integrally under the coupling beam, and the input electrode has a groove at a position under the coupling beam to accommodate the input electrode, and the output electrode is formed integrally under the coupling beam, and the output electrode has a groove at a position under the coupling beam to accommodate the output electrode.

14. The inter-digital bulk acoustic resonator as claimed in claim 1, wherein the input electrode, the output electrode, the input electrode, the output electrode, the input electrode and the output electrode are sequentially disposed among the resonating beams in interlace.

15. An inter-digital bulk acoustic resonator, comprising:
a first resonating structure, comprising:
a plurality of resonating beams and a coupling beam, wherein the plurality of resonating beams are respectively connected at two opposite sides of the coupling beam, and the resonating beams are perpendicular to the coupling beam;
one or more electrodes, disposed between two adjacent resonating beams, and respectively forming capacitor gaps with the two resonating beams, wherein the electrodes drive the two adjacent resonating beams to vibrate or sense a capacitance variation generated due to vibration of the two adjacent resonating beams, and the electrodes and the resonating beams are disposed in parallel;
a second resonating structure, comprising:
a plurality of resonating beams and a coupling beam, wherein the plurality of resonating beams are symmetrically connected at two opposite sides of the coupling beam respectively, and the resonating beams are perpendicular to the coupling beam;
one or more electrodes, disposed between two adjacent resonating beams, and respectively forming capacitor gaps with the two resonating beams, wherein the electrodes drive the two adjacent resonating beams to vibrate or sense a capacitance variation generated due to vibration of the two adjacent resonating beams, and the electrodes and the resonating beams are disposed in parallel;
a substrate; and
a supporting structure, disposed on the substrate, wherein the coupling beam or the first and the second resonating structures are supported on the substrate.

16. The inter-digital bulk acoustic resonator as claimed in claim 15, wherein a width of the resonating beam is $(2 \times n+1) \times \lambda/2$, wherein n is 0, 1, 2, 3, 4, . . . , and $\lambda$ is a resonating wavelength of the resonating beams in a resonating state.

17. The inter-digital bulk acoustic resonator as claimed in claim 15, wherein a length of the coupling beam between the two resonating beams is $(m+1) \times \lambda/4$, wherein m is 0, 1, 2, 3, 4, . . . , and $\lambda$ is a resonating wavelength of the resonating beams in a resonating state.

18. The inter-digital bulk acoustic resonator as claimed in claim 15, wherein the first resonating structure and the second resonating structure are connected in parallel and are connected through the coupling beam.

19. The inter-digital bulk acoustic resonator as claimed in claim 15, wherein the first resonating structure and the second resonating structure are separated.

20. The inter-digital bulk acoustic resonator as claimed in claim 15, wherein a width of the resonating beam of the first resonating structure is not equal to a width of the resonating beam of the second resonating structure.

* * * * *